(12) United States Patent
Murugesh et al.

(10) Patent No.: US 7,135,426 B2
(45) Date of Patent: Nov. 14, 2006

(54) EROSION RESISTANT PROCESS CHAMBER COMPONENTS

(75) Inventors: Laxman Murugesh, San Ramon, CA (US); Stan Detmar, Mountain View, CA (US); Ho Fang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 337 days.

(21) Appl. No.: 10/854,771

(22) Filed: May 25, 2004

(65) Prior Publication Data

US 2005/0274320 A1 Dec. 15, 2005

(51) Int. Cl.
*C04B 35/111* (2006.01)
*C23C 16/00* (2006.01)

(52) U.S. Cl. ............... 501/153; 118/715; 264/678

(58) Field of Classification Search ......... 501/127, 501/153; 118/715; 264/678
See application file for complete search history.

(56) References Cited

U.S. PATENT DOCUMENTS

| | | | |
|---|---|---|---|
| 6,083,451 A | 7/2000 | Gupta et al. | |
| 6,559,026 B1 | 5/2003 | Rossman et al. | |
| 6,565,984 B1 | 5/2003 | Wu et al. | |
| 6,638,886 B1 * | 10/2003 | Gupta et al. | ........ 501/127 |
| 2003/0008765 A1 | 1/2003 | Niwa et al. | |
| 2003/0205479 A1 | 11/2003 | Lin et al. | |

FOREIGN PATENT DOCUMENTS

| | | |
|---|---|---|
| EP | 1114805 A1 | 7/2001 |
| JP | 08081258 A | 7/1995 |
| JP | 11310451 A | 4/1998 |
| WO | WO-2004-003976 A2 | 1/2004 |

* cited by examiner

Primary Examiner—Karl Group
(74) Attorney, Agent, or Firm—Janah & Associates P.C.

(57) ABSTRACT

A substrate processing chamber component demonstrates reduced erosion in an energized gas. The component has a ceramic structure composed of aluminum oxide with a surface exposed to the energized gas in the chamber. The erosion of the surface by the energized gas is substantially reduced by erosion resistant properties of the ceramic structure, which arise from a ratio of the total area of the grains $G_{SA}$ to the total area of the grain boundary regions $GB_{SA}$ in the ceramic structure of from about 0.25 to about 2.5. Also, at least about 80% of the grains in the ceramic structure have a grain size in the range of from about 1 micron to about 20 microns. The ceramic structure also has a purity of at least about 99.8% by weight to further reduce erosion of the surface.

13 Claims, 6 Drawing Sheets

EROSION RESISTANT PROCESS CHAMBER COMPONENTS

BACKGROUND

Embodiments of the present invention relate to substrate processing chamber components that exhibit resistance to erosion.

In the processing of substrates, such as semiconductor wafers and displays, a substrate is placed in a process chamber and exposed to an energized gas to deposit or etch material on the substrate. During these processes, process residues are generated and deposited on internal surfaces in the chamber. For example, in chemical vapor deposition processes, deposition material can deposit on component surfaces in the chamber, such as on deposition rings and shadow rings. In subsequent process cycles, the deposited process residues "flake off" from the chamber component surfaces to fall upon and contaminate the substrate. Consequently, the deposited process residues are periodically cleaned from the chamber surfaces.

However, the exposed surfaces of the chamber components are often eroded during the cleaning processes or when exposed to other erosive gases. For example, during a dry-cleaning process, the components may be exposed to energized halogenated cleaning gases, such as $NF_3$ or $CF_4$, that can rapidly erode the component surfaces. The cleaning gases are typically activated by microwaves or RF energy. Other erosive gases, such as for example etching gases, can also undesirably erode the surfaces of the chamber components. Erosion of the chamber components is undesirable, as particles of the eroded component often flake off from the component and fall upon and contaminate the substrates being processed in the chamber.

In one version, the erosion resistance of the components is improved by providing components comprising an erosion-resistant ceramic material, such as for example, aluminum oxide. Ceramic materials such as aluminum oxide typically exhibit good resistance to erosion in energized gases, and can reduce the generation of particles in the chamber. For example, U.S. Pat. No. 6,083,451 to Gupta et al., describes an alumina ceramic material that is resistant to fluorine-containing plasma. However, even these materials do not provide sufficiently good results, as the ceramic materials can still become eroded by some gas formulations. When they do get eroded, the components can typically be cleaned and re-used in the chamber only a few times before they become too eroded for use and need to be replaced, a practice that can be both costly and result in downtime of the processing apparatus.

The chamber components can also be eroded by chemical solutions that are used to clean the components. Wet cleaning processes can use harsh cleaning chemicals, such as for example solutions comprising hydrofluoric acid, are sometimes used to clean process residues having compositions that are compositionally hard or otherwise difficult to clean. The surfaces of the chamber components are easily excessively eroded by such cleaning solutions, requiring the frequent replacement of the component.

Thus, there is a need for chamber components having improved resistance to erosion by energized gases, such as for example etching and cleaning gases, and cleaning solutions. There is a further need for such erosion resistant components to be made of ceramic materials, and methods of manufacturing such components.

SUMMARY

A substrate processing chamber component is capable of exhibiting reduced erosion in an energized gas. The component has a ceramic structure that is composed of aluminum oxide and has a surface that is exposed to the energized gas in the chamber. The erosion of the surface by the energized gas is substantially reduced by a ceramic structure having erosion resistant properties that arise from the combination of (i) a ratio of the total area of the grains $G_{SA}$ to the total area of the grain boundary regions $GB_{SA}$ of from about 0.25 to about 2.5; (ii) at least about 80% of the grains in the ceramic structure having a grain size in the range of from about 1 micron to about 20 microns; and (iii) the ceramic structure having a purity of at least about 99.8% by weight. The high purity ceramic with fewer grain boundary regions and the desired grain size range has been found to significantly reduce erosion of the surface by a factor of about 10.

In another version, a method of fabricating a component having a ceramic structure composed of aluminum oxide is provided. The method includes providing a ceramic powder having a purity of aluminum oxide of at least about 99.8% by weight. The ceramic powder is then ball milled with milling surfaces having aluminum oxide to form a powder having particle sizes ranging from about 0.2 microns to about 5 microns. A ceramic preform having a predetermined shape is formed from the powder. The ceramic preform is sintered at a temperature of from about 1300° C. to about 1800° C., to form a sintered ceramic material composed of aluminum oxide having a purity of at least about 99.8% by weight. The sintered ceramic material also has grain and grain boundary regions such that the ratio of the total area of the grains $G_{SA}$ to the total area of the grain boundary regions $GB_{SA}$ is from about 0.25 to about 2.5. Furthermore, at least about 80% of the grains in the sintered ceramic material have a size in the range of from about 1 micron to about 20 microns.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
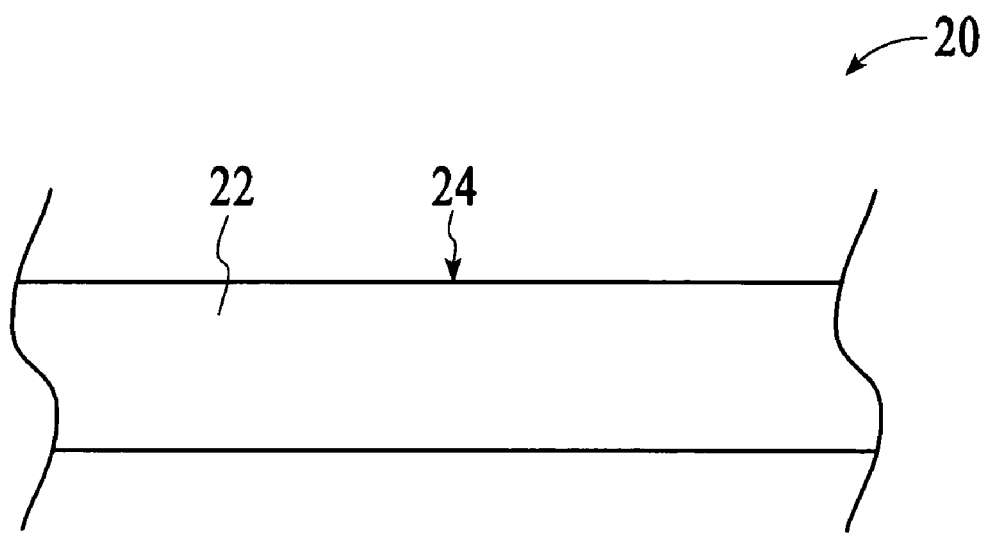
FIG. 1 is a sectional side view of an embodiment of an erosion resistant component having a ceramic structure composed of aluminum oxide.
Figure 6:
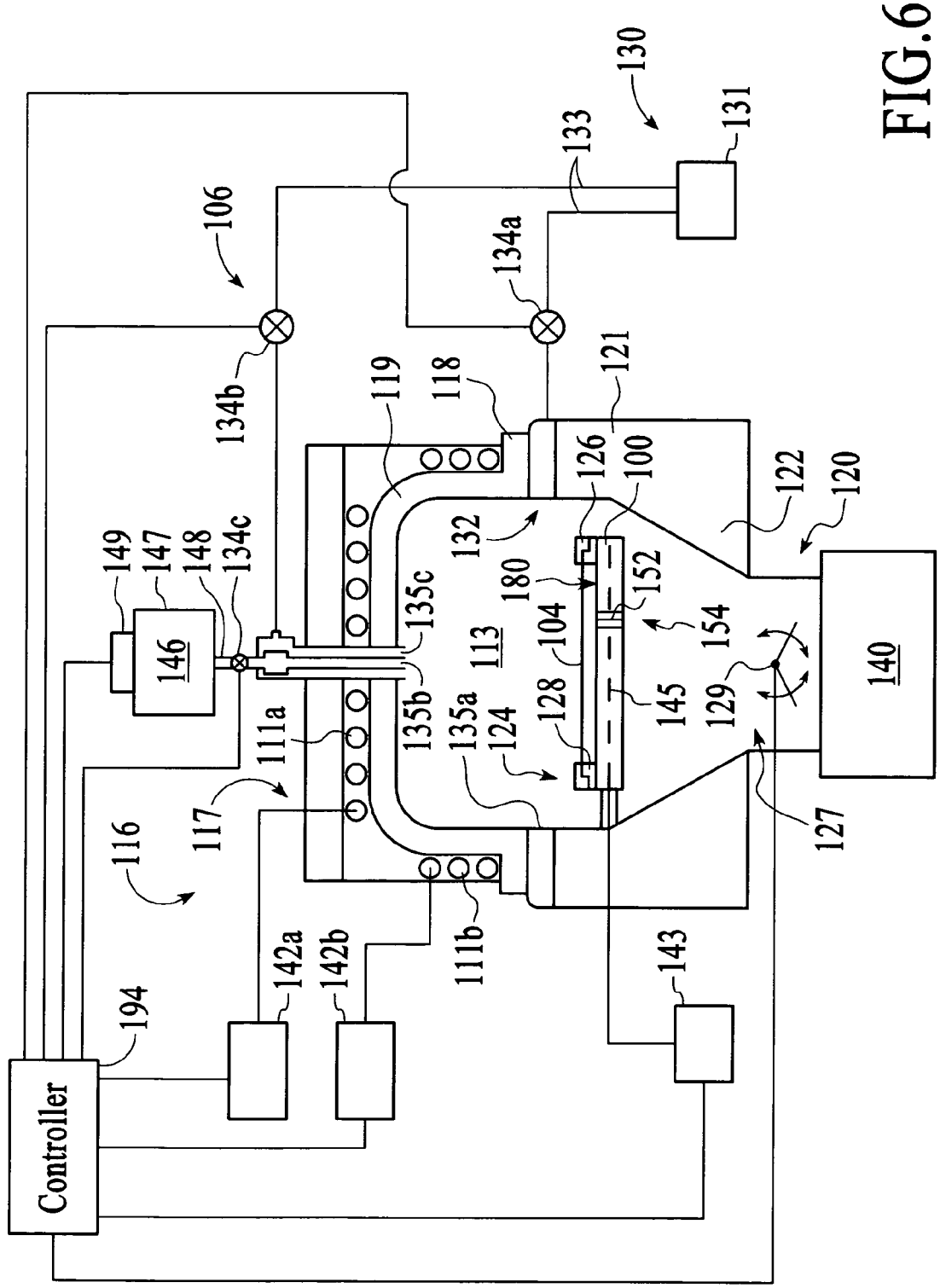
FIG. 6 is a sectional side view of an embodiment of a chemical vapor deposition chamber having the erosion resistant component.

An embodiment of a process chamber component 20, as illustrated schematically in FIG. 1, is capable of being used in a substrate process chamber 106 (as shown in FIG. 6), and comprises a ceramic structure 22 having an exposed surface 24 that is capable of being exposed to an energized gas in the process chamber 106. Chamber components 20 having the ceramic structure 22 can include, for example, a portion of a gas supply 130 that provides process gas in the chamber 106, a substrate support 100 to support a substrate 104 in the chamber 106, a gas energizer 116 that energizes the process gas, chamber enclosure walls 118, and a gas exhaust 120 that exhausts gas from the chamber 106. FIG. 6 illustrates an exemplary version of a chemical vapor deposition chamber 106, in which, the components 20 having the ceramic structure 22 can include a portion of at least one of a chamber enclosure wall 118, such as a domed ceiling 119, components of a process kit 124, such as at least one of a cover ring 126 and a collar ring 128, a surface of the substrate support 100, and lift pins 152. The components 20 having the ceramic structure 22 can also comprise components of chambers such as etching chambers, pre-clean chambers, ashing chambers, physical vapor deposition chambers, and other chambers. Thus, the component 20 should not be limited to the versions illustrated or described herein, but can also include other structures as would be apparent to one of ordinary skill in the art.

In one version, the component 20 comprises a ceramic structure 22 that is composed of aluminum oxide material having erosion resistant properties. The aluminum oxide material exhibits enhanced resistance to erosion in an energized gas environment as well as enhanced resistance to erosion by corrosive cleaning medium, such as cleaning plasmas and cleaning solutions. The aluminum oxide material typically comprises grains 26 of aluminum oxide and grain boundary regions 28 that exist between the grains 26 of aluminum oxide, as shown for example in FIG. 2. It has been discovered that better erosion resistance is obtained when the exposed surface of the aluminum oxide has a ratio of the total area of the grains $G_{SA}$ of aluminum oxide to the total area of the grain boundary regions $GB_{SA}$ that lie between the grains, is within a predetermined range. In one version, the ratio of $G_{SA}$ to $GB_{SA}$ that provides reduced erosion of the ceramic structure 22 is a ratio of from about 0.25 to about 2.5, such as from about 0.5 to about 2.0. It is believed that this ratio is important because a ratio that is too low provides too large of a grain boundary region area with respect to the exposed grain area, and can result in excessive erosion of the grain boundary regions by energized gases or cleaning medium and resultant flaking of the grains of aluminum oxide from the component 20. However, a ratio that is too high can yield a component structure that has undesirable structural properties, such as weak bonding between grains or high sintering temperatures. The ceramic structure 22 composed of aluminum oxide having the ratio of $G_{SA}$ to $GB_{SA}$ within the predetermined range provides improved resistance to erosion in chamber processes, allowing the component 20 to be used to process substrates substantially without contaminating the substrates, while also providing relative ease in fabrication of the component.

Figure 2:
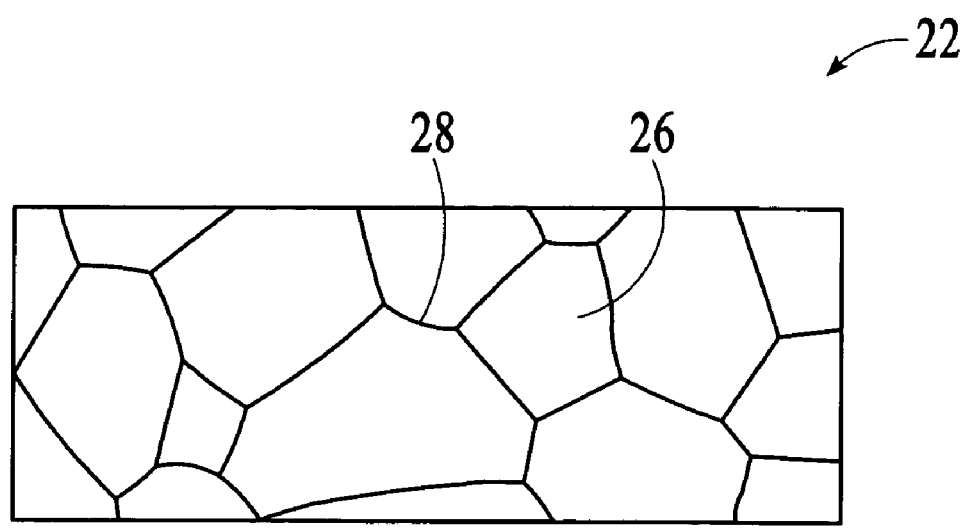
FIG. 2 is a sectional view of an embodiment of a cross-section of the component of FIG. 1 showing grains and grain boundary regions.

FIG. 2 shows an example of a cross-section of a ceramic structure 22 composed of an aluminum oxide material having such grains 26 and grain boundary regions 28. The cross-section can be obtained, for example, using scanning electron microscopy (SEM) or other technique capable of yielding a cross-sectional image of the grains 26 and grain boundary regions 28, as is known to those of ordinary skill in the art. To calculate the ratio of $G_{SA}$ to $GB_{SA}$, the total area of the grains 26 for a given cross section can be measured and divided by the total area of the grain boundary regions 28 in the cross-section. In one version, the areas $G_{SA}$ and $GB_{SA}$ can be determined by laying a grid over the cross-section, and counting the number of grid points that lie on the grains 26 and the grain boundary regions 28 to determine $G_{SA}$ and $GB_{SA}$, respectively. Other suitable methods of determining the grain and grain boundary areas can also be used to determine the ratio.

The aluminum oxide material of which the ceramic structure 22 is composed also desirably comprises grains having a grain size that is maintained within a predetermined range to provide resistance to erosion by an energized gas and cleaning solutions. Grains 26 that are too small can easily become loose and separate from the ceramic structure 22, which can result in contamination of the substrate 104. Grains 26 that are too large can be problematic because the aluminum oxide material may loose desired the mechanical properties, such as tensile strength, which may be necessary for the proper function of the component 20 having the structure composed of aluminum oxide. In one version of a ceramic structure 22 composed of a suitable aluminum oxide material, at least about 80% of the grains 26 in the aluminum oxide material have a grain size in the range of from about 1 micron to about 20. The ceramic structure 22 may also be composed of aluminum oxide material for which at least about 95% of the grains 26 have a grain size of from about 5 to about 30 microns, and even have a grain size of from about 8 to about 16 microns. The ceramic structure 22 composed of aluminum oxide also desirably comprises a volume of the grain boundary regions 28 that is within a range that provides improved processing results. In one version, the grain boundary regions 28 comprise from about 1% to about 15% by volume of the total volume of the ceramic structure 22.

Yet another property of the ceramic structure 22 that is controlled to provide improved erosion resistance is the purity of the aluminum oxide material. Reducing the impurity level in the aluminum oxide material improves the erosion resistance performance of the aluminum oxide at least in part by reducing the number of contaminant compounds, such as silicate compounds, that can be formed by the impurities. Formation of contaminant compounds such as silicate compounds can increase erosion levels, because the silicate compounds can form in the grain boundary region or surface 24 of the ceramic structure where they can be readily attacked and etched away by energized and halogenated gases and erosive cleaning gases. This can cause adjacent grains 26 of aluminum oxide at the exposed surface 24 of the ceramic structure 22 to become loose and flake off, thereby eroding the exposed surface 24 of the ceramic structure 22, and can also contaminate the substrates 104 being processed. Accordingly, the aluminum oxide or other ceramic structure 22 is desirably composed of ceramic material (or aluminum oxide) having a relatively high purity of at least about 99.8% by weight, such as from about 99.8% to about 99.9% by weight, and even at least about 99.9% by weight. The highly pure aluminum oxide material desirably comprises less than about 110 ppm by weight of silicon to reduce the number of silicate compounds that can be formed. The aluminum oxide material also desirably comprises reduced amounts of other impurities, such as less than about 400 ppm by weight of sodium and even less than about 200 ppm by weight of sodium. The aluminum oxide material can also comprise less than about 100 ppm by weight of iron, and also less than about 600 ppm by weight of magnesium. The total amount of impurities in the aluminum oxide material is desirably maintained below about 1550 ppm by weight, and even below about 1350 ppm by weight. The level of impurities in the aluminum oxide material can be determined by a method such as, for example, glow discharge mass spectrometry, or by other purity determination methods known to those of ordinary skill in art.

The ceramic structure 22 composed of the aluminum oxide material is formed by a method which provides the desired erosion resistant properties of the aluminum oxide material. In one version, a suitable method for forming the aluminum oxide material includes (i) forming a ceramic powder comprising highly pure aluminum oxide, (ii) ball milling the ceramic powder with milling surfaces comprising aluminum oxide to form a ceramic powder having the desired particle sizes, (iii) forming a ceramic preform having a predetermined shape from the ceramic powder, and (iv) sintering the ceramic preform to form a sintered aluminum oxide material comprising the desired erosion resistant characteristics, including the desired grain and grain boundary region properties and the desired purity.

The ceramic structure 22 can be formed by forming a ceramic precursor powder having a high purity of aluminum oxide and few impurities. For example the ceramic powder can comprise an aluminum oxide purity of at least about 99.8% by weight, and even at least about 99.9% by weight. A small amount of binder or sintering agent, such as at least one of $Mg(NO_3)_2$, MgO, and $SiO_2$ can also be provided in the ceramic powder. However, the amount of such binder preferably does not exceed about 0.5% by weight of the ceramic powder, and can even be less than about 0.2% by weight of the ceramic powder, to reduce the number of impurities in the aluminum oxide material. In another version, small quantities of a binder that is resistant to erosion may be provided to inhibit erosion of the ceramic structure 22. For example, the binder may be substantially unreactive with energized gases and cleaning solutions comprising halogen-containing compounds, such as fluorine containing compounds, which may be provided to clean the component or perform chamber processes. Examples of suitable erosion resistant binders can include at least one of yttria and yttrium aluminum oxide provided in an amount that does not exceed about 0.5% by weight of the ceramic pre-cursor powder.

Figure 3:
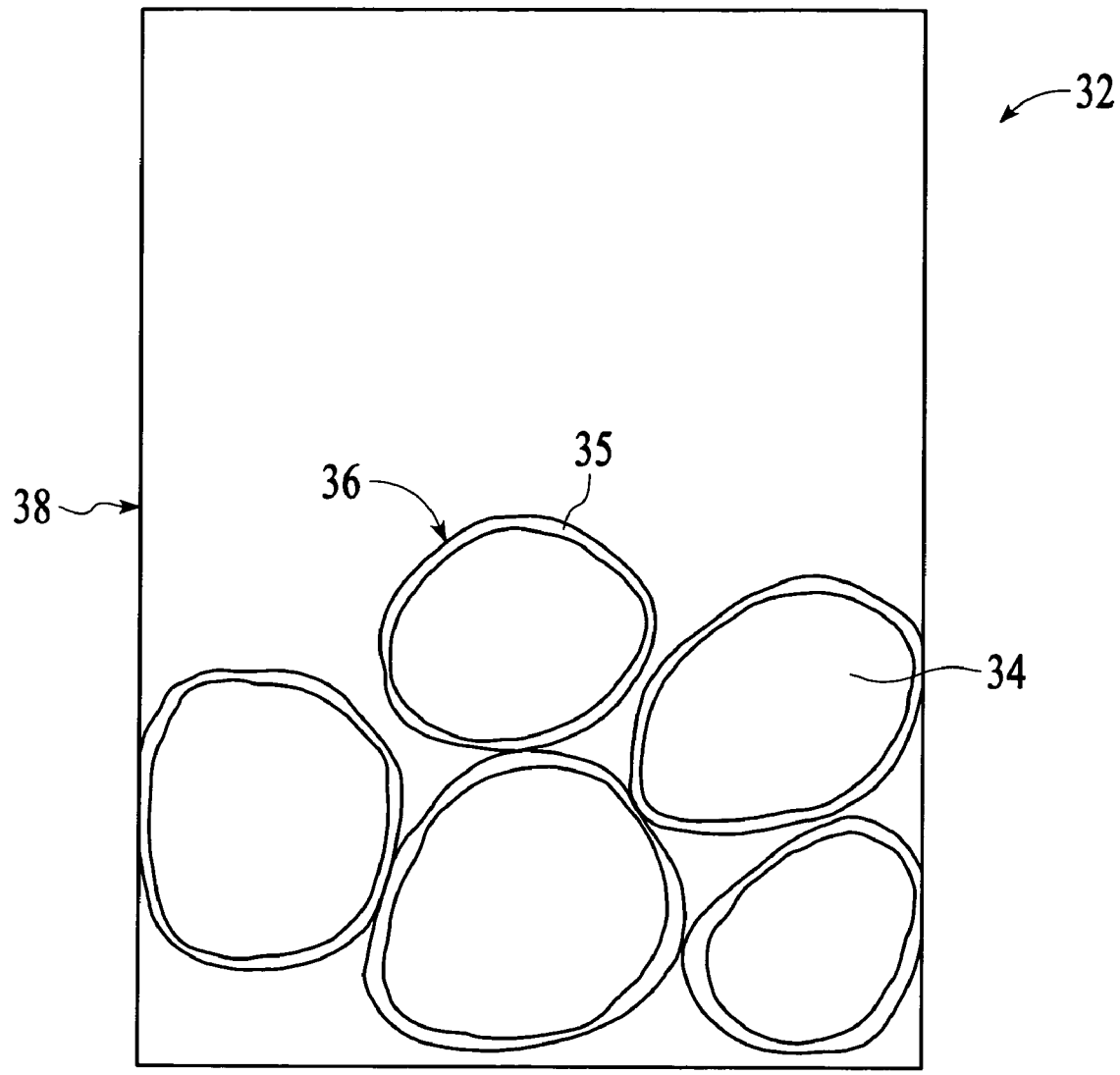
FIG. 3 is a sectional side view of an embodiment of a ball milling container.

The ceramic powder can be milled in a ball milling process to provide particles of powder having a desired size as well as to mix the powder components. In one embodiment of the ball milling process, as shown for example in FIG. 3, the ceramic powder is provided in a milling container 32 having milling balls 34. A liquid such as water or alcohol can be added to the powder to form a slurry. One or more of the container and milling balls are set into motion, for example by rotation, to grind and mill the ceramic powder in the milling container 32. Furthermore, as it is important to reduce contamination of the aluminum oxide powder during the milling process, in one version the milling surfaces 36 in the ball milling container 32 can comprise a high-purity aluminum oxide material. The high purity aluminum oxide surfaces 36 can include surfaces 36 of the milling balls 34 as well as surfaces 36 of the container walls 38. For example, the milling balls 34 can comprise aluminum oxide having a purity of at least about 95% by weight. The surfaces 36 can also be the surfaces of aluminum oxide coatings 35 on the milling balls and/or container walls. Milling of the ceramic powder is continued until the powder has been milled down to provide particles having a desired size, which may be a particle size of less than about 5 microns, such as a particle size of from about 0.2 microns to about 5 microns.

Figure 4:
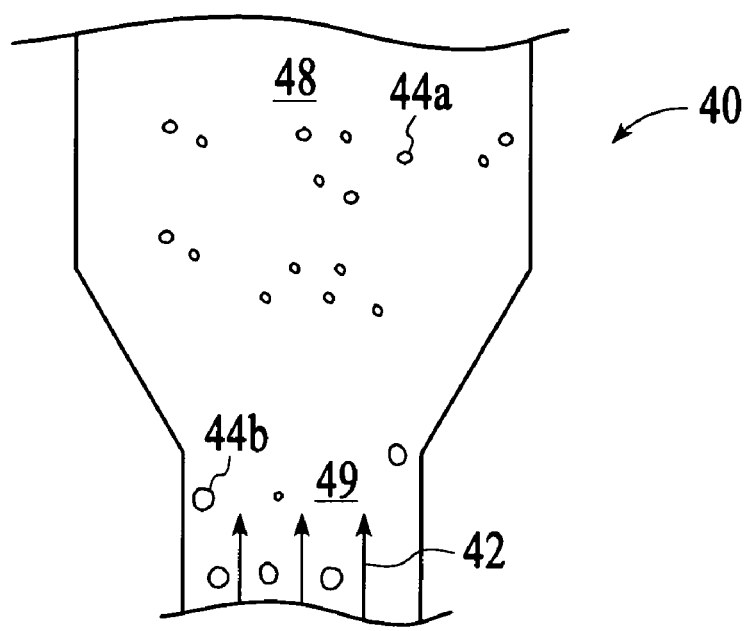
FIG. 4 is a sectional side view of an embodiment of a spray drying chamber.

A spray drying and separation process can also be performed on the ceramic powder to dry the ceramic powder and to separate out very fine particles of powder material. In one version, a slurry of the powder is introduced into a spray drying chamber 40 which provides heated gas 42 from the bottom of the chamber 40 to dry the ceramic powder and to separate out very fine ceramic powder particles from the remaining powder. An example of an embodiment of a spray drying chamber 40 is shown in FIG. 4. The heated gas 42 suspends the fine particles 44a within an upper portion 48 of the separating chamber 40. Larger particle agglomerations 44b of the dried ceramic powder settle towards a bottom portion 49 of the separating chamber 40, where they can be collected separately from the fine particles. The heated gas 42 may be, for example, air heated to a temperature of at least about 120° C., such as from about 120° C. to about 250° C. Other separating devices, such as for example filters, can also be used to separate out fine particles, and other drying processes can also be performed.

To provide a predetermined component shape, a molding process can be performed to form a ceramic preform 58 having a desired shape from the ceramic powder. In one version, a cold isostatic pressing process is performed to mold the powder into the desired shape. In the cold isostatic pressing process, the powder is combined with a liquid binding agent such as the organic binding agent polyvinyl alcohol. The isostatic pressing device 50 typically comprises a container 52 having flexible walls 56, such as a rubber bag, into which the mixture 54 is placed, as shown for example in FIG. 5a. A pressure is uniformly applied on the walls 56 of the flexible container 52 to compact the mixture 54 and form the ceramic preform 58 having the desired shape. The pressure can be applied, for example, by immersing the flexible container in water, and also by other methods of providing pressure. The molded ceramic preform can be further shaped by machining the preform to provide the desired size.

Figure 5A:
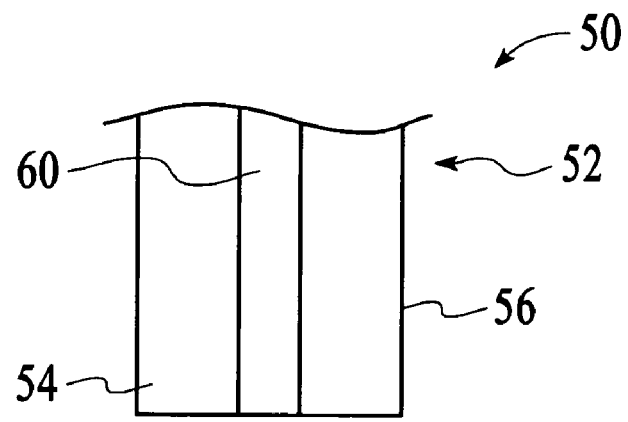
FIG. 5a is a sectional side view of an embodiment of a cold isostatic pressing apparatus.
Figure 5B:
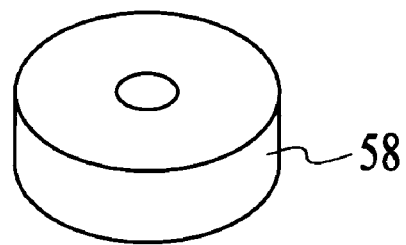
FIG. 5b is a side view of an embodiment of a shaped ceramic preform.

In one version, a molded ceramic preform 58 can be provided in a cylindrical and even a ring-like shape, an embodiment of which is shown in FIG. 5b. For example, as shown in FIG. 5a, the ceramic powder and binding agent mixture 54 can be provided in an isostatic pressing container 52, and a shaping aid 60 such as a tube or other cylindrical structure can be positioned inside the mixture 54. The mixture 54 is compacted around the tube during the isostatic pressing process, to provide a ceramic preform 58 having a cylindrical shape with a center formed by the tube. The ceramic preform 58 can be separated from the tube, and can be machined to provide ceramic preform structures, such as rings, that have a suitable shape for substrate processing.

The shaped ceramic preform 58 is sintered to form a sintered ceramic material composed of aluminum oxide that has the desired properties and structure. In one version, the ceramic preform 58 is sintered at a temperature of from about 1300° C. to about 1800° C. for a duration of from about 48 to about 96 hours, typically at a pressure of about 1 atm. The sintered ceramic material can be further shaped, for example by at least one of machining, polishing, laser drilling, and other methods, to provide the desired ceramic structure 22.

The resulting ceramic structure 22 composed of aluminum oxide can be cleaned to remove any remaining impurities or loose particles before installing the ceramic structure 22 in a process chamber 106. In one version, the ceramic structure 22 is immersed in first a dilute and then in a more concentrated solution of $HNO_3$ and HCl. Other cleaning solutions and solvents can also be used to clean the structure, such as HF and $HNO_3$, $H_2SO_4$, $H_3PO_4$, and de-ionized water, and other cleaning methods such as ultrasonication can also be used.

After the component 20 comprising the ceramic structure 22 has been used to process substrates 104 in the process chamber 106, a cleaning and recycling process can be performed to clean the ceramic structure 22 to remove process residues that may have deposited on the surface 24 of the structure 22. A suitable process for cleaning the ceramic structure 22 can comprise at least one of a dry-cleaning and wet-cleaning step. In one version, a suitable dry-cleaning process comprises providing an energized cleaning gas comprising a fluorinated gas, such as at least one of $NF_3$ and $CF_4$, to clean surfaces in the chamber 106. A suitable wet-cleaning process can comprise immersing the surface 24 of the ceramic structure 22 in a cleaning solutions comprising at least one of (i) HF and $HNO_3$, and (ii) $H_2O_2$ and $NH_4OH$. Once the process residues have been substantially cleaned from the surface 24 of the ceramic structure 22, the structure 22 can be re-used in the chamber to process subsequent substrates 104.

The component 20 comprising the ceramic structure 22 composed of aluminum oxide having the improved erosion resistance provides improved process performance and also allows for cleaning and recycling of the component 20 without excessive erosion of the component 20 or the generation of unacceptable particle levels in the process chamber 106. For example, a component 20 comprising the ceramic structure 22 composed of aluminum oxide having the ratio of the area of the grains $G_{SA}$ to the area of the grain boundary regions $GB_{SA}$ of from about 0.25 to about 2.5, and having the other desired grain size and purity properties, may be capable of being cleaned and re-used at least about 10 times, and even up to about 25 times, substantially without eroding and contaminating substrates 104 begin processed in the chamber 106. By comparison, components 20 that do not have the ceramic structure composed of aluminum oxide with the erosion reduction properties may be recycled no more than about 3 times before the component 20 must be disposed of and replaced to prevent contamination of the substrates 104. Furthermore, because of the improved erosion resistance properties, the component 20 having the improved ceramic structure 22 can be used to process large numbers of substrates 104 substantially without contaminating the substrates 104 before cleaning the component. Thus, the improved ceramic structure 22 composed of aluminum oxide having the erosion reducing properties provides improved results in the processing of substrates, and reduces the costs associated with disposal and replacement of eroded components.

In one version, the component 20 comprising the ceramic structure 22 is a part of a process chamber 106 that is capable of performing a chemical vapor deposition process such as an HDP-CVD chamber, an embodiment of which is shown in FIG. 6. A version of an HDP-CVD chamber is also described in U.S. Pat. No. 6,559,026 to Rossman et al, issued May 6, 2003, which is herein incorporated by reference in its entirety. The HDP-CVD chamber shown in FIG. 6 comprises enclosure walls 118, which may comprise a ceiling 119, sidewalls 121, and a bottom wall 122 that enclose a process zone 113. The enclosure walls 118 can comprise a domed ceiling 119 over the process zone 113. A deposition gas can be introduced into the chamber 106 through a gas supply 130 that includes a deposition gas source 131, and a gas distributor 132. In the version shown in FIG. 6, the gas distributor 132 comprises one or more conduits 133 having one or more gas flow valves 134a,b and one or more gas outlets 135a around a periphery of the substrate 104, as well as one or more outlets 135b,c above the substrate 104 to provide an optimized flow of deposition gas in the chamber 106. The deposition gas can comprise, for example, one or more of $SiH_4$ and $O_2$. An electrode 145 in the support 100 below the substrate 104 may be powered by an electrode power supply 143 to electrostatically hold the substrate on the support 100 during processing. Spent process gas and process byproducts are exhausted from the chamber 106 through an exhaust 120 which may include an exhaust conduit 127 that receives spent process gas from the process zone 113, a throttle valve 129 to control the pressure of process gas in the chamber 106, and one or more exhaust pumps 140.

In one version, the support 100 also comprises a process kit 124 comprising one or more rings, such as a cover ring 126 and a collar ring 128 that covers at least a portion of the upper surface of the support 100 to inhibit erosion of the support 100. In one version, the collar ring 128 at least partially surrounds the substrate 104 to protect portions of the support 100 not covered by the substrate 104. The cover ring 126 encircles and covers at least a portion of the collar ring 128, and reduces the deposition of particles onto both the collar ring 128 and the underlying support 100. A lift pin assembly 154 can also be provided to position the substrate 104 on a substrate receiving surface 180 of the support 100. The lift pin assembly 154 comprises a plurality of lift pins 152 adapted to contact the underside of the substrate 104 to lift and lower the substrate 104 onto the substrate receiving surface 180.

In one version, the deposition gas may be energized to process the substrate 104 by a gas energizer 116 comprising an antenna 117 having one or more inductor coils 111a,b which may have a circular symmetry about the center of the chamber to couple energy to the process gas in the process zone 113 of the chamber 106. For example, the antenna 117 may comprise a first inductor coil 111a about a top portion of the domed ceiling 119 of the chamber 106, and a second inductor coil 111b about a side portion of the domed ceiling 119. The inductor coils may be separately powered by first and second RF power supplies 142a,b. The gas energizer 116 may also comprise one or more process electrodes that may be powered to energize the process gas. A remote chamber 147 may also be provided to energize a process gas, such as a cleaning gas, in a remote zone 146. The process gas can be energized by a remote zone power supply 149, such as a microwave power supply, and the energized gas can be delivered via a conduit 148 having a flow valve 134c to the chamber 106, for example to clean the chamber.

To process a substrate 104, the process chamber 106 is evacuated and maintained at a predetermined sub-atmospheric pressure. The substrate 104 is then provided on the support 100 by a substrate transport, such as for example a robot arm and lift pin assembly 154. The substrate 104 may be held on the support 100 by applying a voltage to an electrode in the support 100 via an electrode power supply 143. The gas supply 130 provides a process gas to the chamber 106 and the gas energizer 116 couples RF or microwave energy to the process gas to energize the gas to process the substrate 104. Effluent generated during the chamber process is exhausted from the chamber 106 by the exhaust 120.

The chamber 106 can be controlled by a controller 194 that comprises program code having instruction sets to operate components of the chamber 106 to process substrates 104 in the chamber 106. For example, the controller 194 can comprise a substrate positioning instruction set to operate one or more of the substrate support 100 and robot arm and lift pins 152 to position a substrate 104 in the chamber 106; a gas flow control instruction set to operate the gas supply 130 and flow control valves to set a flow of gas to the chamber 106; a gas pressure control instruction set to operate the exhaust 120 and throttle valve to maintain a pressure in the chamber 106; a gas energizer control instruction set to operate the gas energizer 116 to set a gas energizing power level; a temperature control instruction set to control temperatures in the chamber 106; and a process monitoring instruction set to monitor the process in the chamber 106.

EXAMPLES

The following examples demonstrate the improved results provided by ceramic structures 22 composed of aluminum oxide having erosion resistant properties over structures without the erosion resistant aluminum oxide material.

In these examples, ceramic materials including both lower purity and higher purity aluminum oxide were tested to determine the erosion resistance of the materials. The lower purity materials included an aluminum oxide material having a purity of about 99.5% by weight, and an aluminum oxide material having a purity of about 99.7% by weight. The higher purity materials included an aluminum oxide material having a purity of about 99.8% by weight, and an aluminum oxide material having a purity of about 99.9% by weight. In the testing process, each material was first cleaned in an ultrasonication process by immersing in an ultrasonication bath having ultrasonic waves passing therethrough. The concentration of particles formed on the surface of each material per $cm^2$ of the surface was measured for increasing ultrasonication cleaning time. The materials were then immersed in an aqueous cleaning solution comprising 15% by weight HF and 20% by weight $HNO_3$. After cleaning with the cleaning solution, the materials were again immersed in the ultrasonication bath and the concentration of particles per $cm^2$ formed on the material surface was measured for increasing ultrasonication cleaning time. The results for the cleaning process are shown in FIGS. 7a through 7d. The cleaning results demonstrate that the materials comprising the higher aluminum oxide purities have higher resistance to erosion from the cleaning solution and generate fewer contaminant particles, while the materials having lower purities are more susceptible to erosion, and generate more contaminant particles.

Figure 7A:
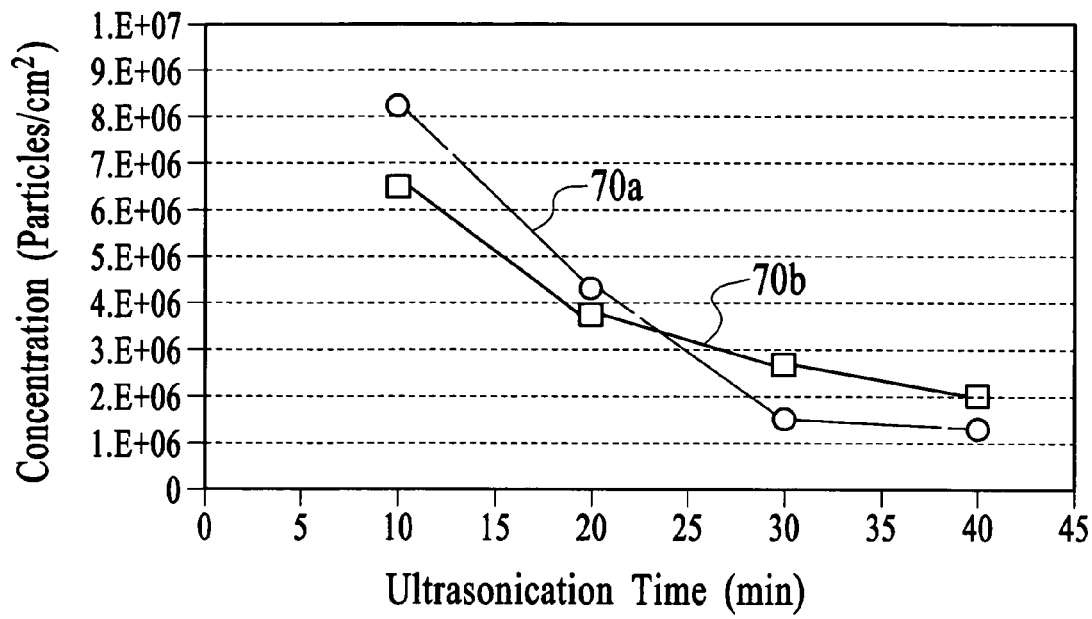
FIGS. 7a–7d are graphs showing the concentration of particles on the surface of materials for increasing ultrasonication time before and after cleaning with a cleaning solution.

FIG. 7a shows the results for the 99.5% purity aluminum oxide material. After an ultrasonication time of about 10 minutes, the material exhibited an unacceptably high concentration of particles on the material surface of about $8.0 \times 10^6$ particles per $cm^2$ of material surface area, as shown by line 70a. This particle concentration was reduced to a little over about $1.0 \times 10^6$ after about 40 minutes of ultrasonication time. However, after cleaning the material with the HF and $HNO_3$ cleaning solution, the concentration of particles was again at an unacceptably high level of about $6.5 \times 10^6$ particles/$cm^2$, as shown by line 70b. This high particle level indicates that the material is being eroded at an excessively high rate by the HF and $HNO_3$ cleaning solution, and thus the ability of the material to be cleaned and recycled for re-use may be limited. Also, this erosion susceptibility may indicate that the potential for the material to erode during chamber processes and contaminate substrates is also unacceptably high.

Figure 7B:
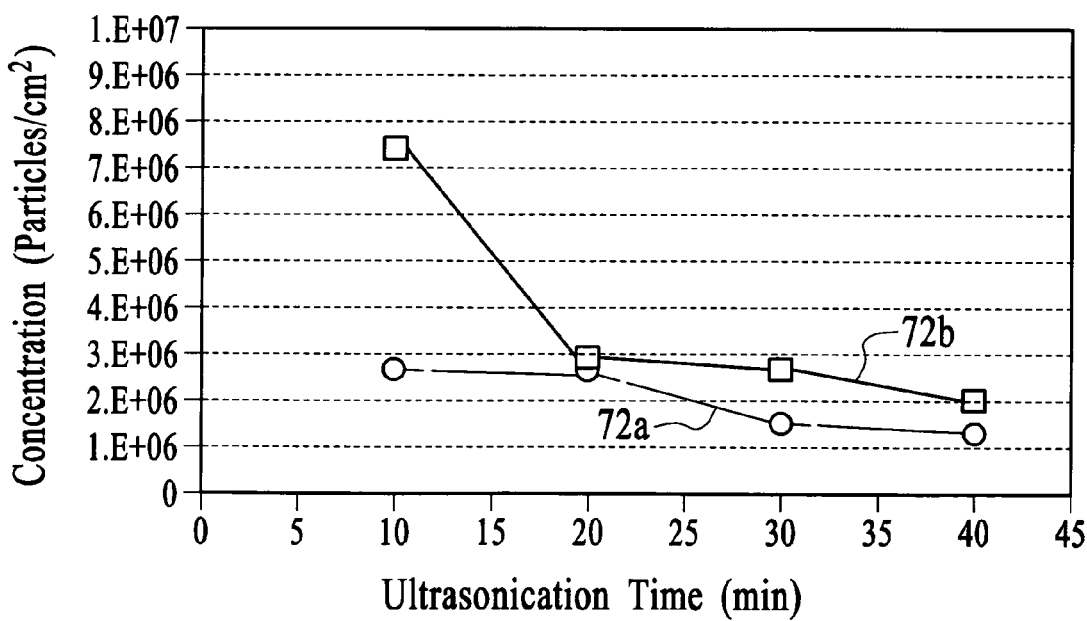

FIG. 7b shows the results for the 99.7% purity aluminum oxide material. This material has an initial reduced concentration of particles of only a little under $3.0 \times 10^6$ particles/$cm^2$ on the material surface after only about 10 minutes of ultrasonication time, as shown by line 72a. The particle concentration remains low during the ultrasonication process with a concentration of about $1.0 \times 10^6$ particles/$cm^2$ after about 40 minutes of ultrasonication time. However, after cleaning with the HF and $HNO_3$ solution, unacceptably high levels of particles are generated, with the material exhibiting over $7.0 \times 10^6$ particles/$cm^2$ after about 10 minutes of ultrasonication time, as shown by line 72b. Thus, the material having the 99.7% purity is being eroded by the cleaning solution of HF and $HNO_3$ at an unacceptably high rate.

Figure 7C:
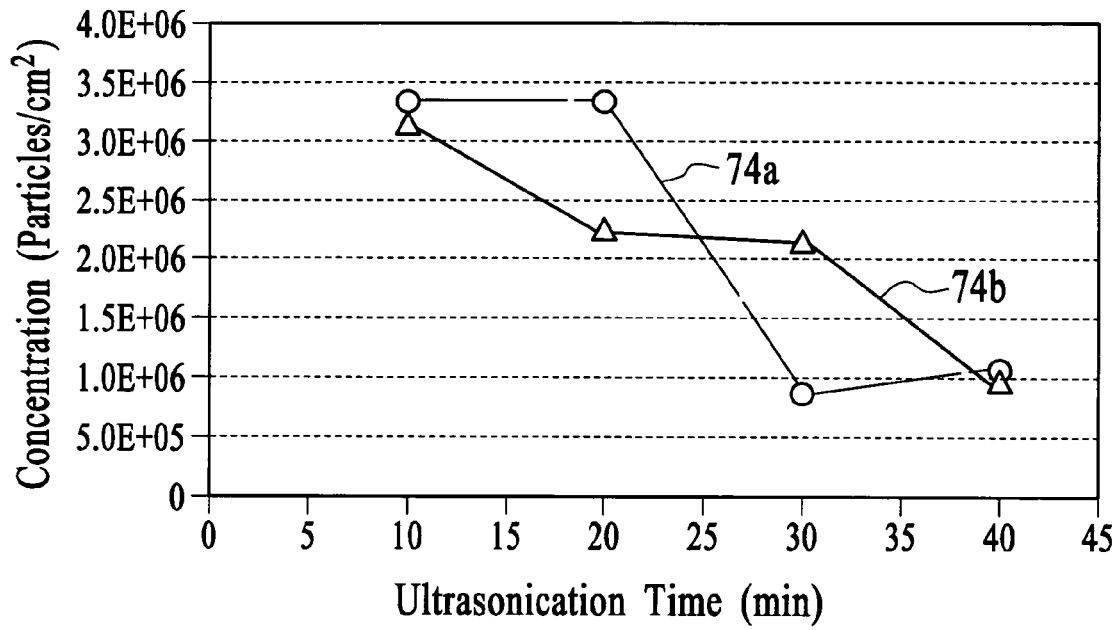

FIG. 7c demonstrates the improved results provided by the aluminum oxide material having the higher purity of about 99.8% by weight. The material has an initial relatively low concentration of particles of only a little more than $3.0 \times 10^6$ particles/$cm^2$ after about 10 minutes of ultrasonication time, as shown by line 74a. The particle concentration remains low during the ultrasonication process, with a concentration of about $1.0 \times 10^6$ particles/$cm^2$ after about 40 minutes of ultrasonication time. After cleaning with the solution of HF and $HNO_3$ the number of particles generated on the surface of the material also remained at the relatively low level of only about $3.0 \times 10^6$ particles/$cm^2$ after about 10 minutes of ultrasonication time, and reduced to a concentration of about $1.0 \times 10^6$ after about 40 minutes of ultrasonication time, as shown by line 74b. Thus, the material having the purity of about 99.8% by weight maintains a desirably low number of particles even after cleaning with erosive cleaning solutions, and thus provides unexpectedly improved results in the erosion resistance of the material during cleaning processes.

Figure 7D:
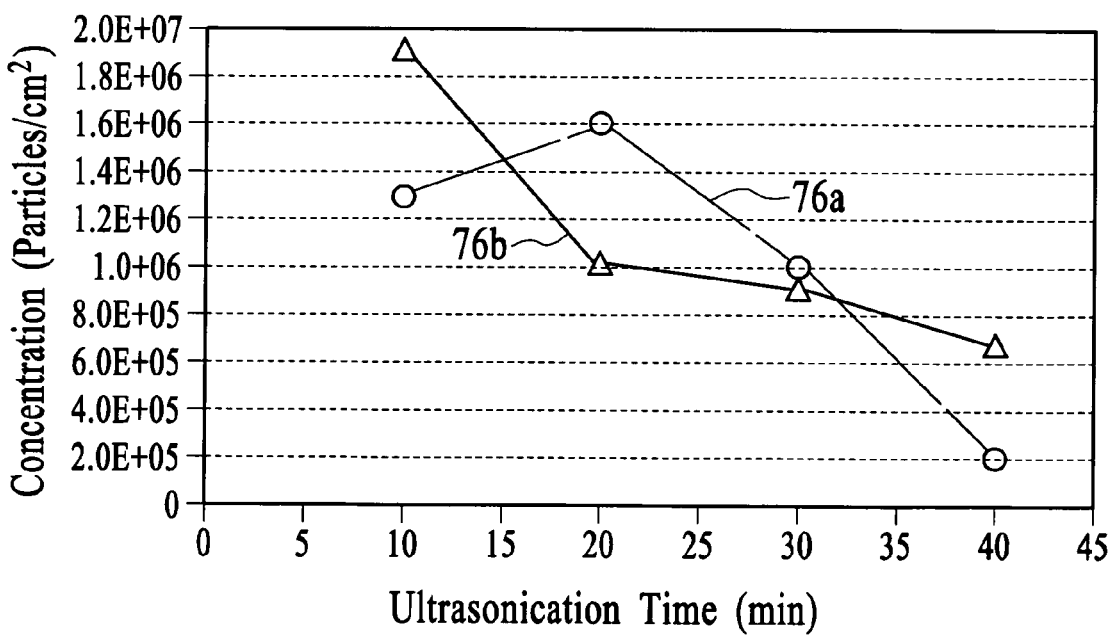

FIG. 7d demonstrates the improved results provided by the aluminum oxide material having the even higher purity of about 99.9% by weight. The material exhibited an initial concentration of particles before cleaning with the cleaning solution that was even lower than that of the 99.8% by weight material. The initial concentration of particles on the surface of the material was only about $1.3 \times 10^6$ particles/$cm^2$ after about 10 minutes of ultrasonication time, and was reduced to a concentration of only about $2.0 \times 10^5$ particles/$cm^2$ after about 40 minutes of ultrasonication time, as shown by line 76a. The number of particles did not significantly increase after cleaning with the cleaning solution comprising HF and $HNO_3$, and remained at acceptably low levels. The concentration of particles after cleaning with the cleaning solution only increased to about $1.9 \times 10^6$ particles/$cm^2$, as measured after about 10 minutes of ultrasonication time, and was reduced to only a little more than $6.0 \times 10^5$ after about 40 minutes of ultrasonic time, as shown by line 76b. Thus, the high purity material showed enhanced resistance to corrosion in comparison to the lower purity materials.

Although exemplary embodiments of the present invention are shown and described, those of ordinary skill in the art may devise other embodiments which incorporate the present invention, and which are also within the scope of the present invention. For example, the ceramic structure 22 composed of aluminum oxide may comprise at least a portion of components 20 other than those specifically described. Also, the improved ceramic structure 22 composed of aluminum oxide may be fabricated by methods other than those specifically described. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. A substrate processing chamber component having reduced erosion in an energized gas, the component comprising:
    a ceramic structure composed of aluminum oxide and having a surface that is exposed to the energized gas in the chamber, the ceramic structure comprising:
        (a) grains and grain boundary regions such that the ratio of the total area of the grains $G_{SA}$ to the total area of the grain boundary regions $GB_{SA}$ is from about 0.25 to about 2.5;
        (b) at least about 80% of the grains having a grain size in the range of from about 1 micron to about 20 microns; and
        (c) a purity of at least about 99.8% by weight, whereby erosion of the surface by the energized gas is substantially reduced.

2. A component according to claim 1 wherein at least about 95% of the grains have a grain size in the range of from about 5 to about 30 microns.

3. A component according to claim 2 wherein at least about 95% of the grains have a grain size of from about 8 to about 16 microns.

4. A component according to claim 1 wherein the grain boundary regions comprise from about 1% to about 15% by volume of the ceramic structure.

5. A component according to claim 1 wherein the ceramic structure comprises less than about 1550 ppm by weight of impurities.

6. A component according to claim 1 wherein the ceramic structure comprises less than about 110 ppm by weight of silicon.

7. A component according to claim 6 wherein the ceramic structure comprises less than about 400 ppm by weight of sodium, less than about 100 ppm by weight of iron, and less than about 600 ppm by weight of magnesium.

8. A component according to claim 1 wherein the structure comprises at least a portion of one or more of a ceiling, collar ring, cover ring, and lift pin.

9. A substrate processing chamber comprising the component of claim 1, the processing chamber comprising a substrate support, a gas supply, a gas energizer and an exhaust.

10. A method of fabricating a component comprising a ceramic structure composed of aluminum oxide, the method comprising:
    (a) providing a ceramic powder comprising aluminum oxide having a purity of at least about 99.8% by weight;
    (b) ball milling the ceramic powder with milling surfaces comprising aluminum oxide to form a powder having particle sizes ranging from about 0.2 microns to about 5 microns;
    (c) forming a ceramic preform having a predetermined shape from the powder; and
    (d) sintering the ceramic preform at a temperature of from about 1300° C. to about 1800° C., thereby forming a sintered ceramic material composed of aluminum oxide having a purity of at least about 99.8% by weight, wherein the sintered ceramic material comprises grain and grain boundary regions such that the ratio of the total area of the grains $G_{SA}$ to the total area of the grain boundary regions $GB_{SA}$ is from about 0.25 to about 2.5, and wherein at least about 80% of the grains having a size in the range of from about 1 micron to about 20 microns.

11. A method according to claim 10 wherein the ceramic powder comprises a binder material comprising at least one of magnesium nitrate, magnesium oxide and silicon oxide, the binder material comprising less than about 0.5% by weight of the powder.

12. A method according to claim 10 wherein the milling surfaces comprise an aluminum oxide purity of at least about 95% by weight.

13. A component formed according to the method of claim 10, the component comprising one or more of a ceiling, collar ring, cover ring, ceiling, and lift pin.

* * * * *